United States Patent
Inamori et al.

(10) Patent No.: US 7,425,872 B2
(45) Date of Patent: Sep. 16, 2008

(54) RADIO FREQUENCY POWER AMPLIFIER

(75) Inventors: Masahiko Inamori, Osaka (JP); Kazuhiko Ohhashi, Kyoto (JP); Hiroshi Sugiyama, Osaka (JP); Masao Nakayama, Shiga (JP); Kaname Motoyoshi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 119 days.

(21) Appl. No.: 11/499,650

(22) Filed: Aug. 7, 2006

(65) Prior Publication Data

US 2007/0096809 A1    May 3, 2007

(30) Foreign Application Priority Data

Oct. 24, 2005   (JP) ............................. 2005-308667

(51) Int. Cl.
*H03F 3/68* (2006.01)
*H03F 3/191* (2006.01)

(52) U.S. Cl. ...................... 330/295; 330/306
(58) Field of Classification Search ................. 330/295, 330/302, 306
See application file for complete search history.

(56) References Cited

U.S. PATENT DOCUMENTS 5,608,353 A      3/1997   Pratt
6,400,226 B2 *   6/2002   Sato ........................... 330/286

FOREIGN PATENT DOCUMENTS

JP          2001-274636        10/2001

* cited by examiner

*Primary Examiner*—Steven J Mottola
(74) *Attorney, Agent, or Firm*—McDermott Will & Emery LLP

(57) ABSTRACT

A bias voltage is applied via a first resistance to the base of a first transistor, and a radio frequency signal is input via a first capacitor to the base of the first transistor. The bias voltage is applied via a second resistance to the base of a second transistor. The bias voltage is applied via a third resistance to the base of a third transistor, and the radio frequency signal RF is input via a third capacitor to the base of the third transistor. A first band rejection filter is provided between the base of the first transistor and the base of the second transistor. A second band rejection filter is provided between the base of the second transistor and the base of the third transistor. The collectors of the first to third transistors are connected in common and the emitters thereof are all grounded.

16 Claims, 14 Drawing Sheets

RADIO FREQUENCY POWER AMPLIFIER

BACKGROUND OF THE INVENTION

1. Field of the Invention

The present invention relates to a radio frequency power amplifier which is used to transmit and receive a radio frequency signal. More particularly, the present invention relates to a low-noise and high-efficiency radio frequency power amplifier comprising a bipolar transistor.

2. Description of the Background Art

In recent years, high performance and small size are key factors for digital (e.g., WCDMA) mobile telephone terminals. Radio frequency power amplifiers which are used in the mobile telephone terminals so as to perform power amplification to output a high power, require small size, high efficiency, low distortion, and low noise.

A transistor included in radio frequency power amplifiers for mobile telephone terminals is often a heterojunction bipolar transistor (HBT) made of a gallium arsenide (GaAs) material which enables a high-speed operation. The HBT has a high current amplification factor β and a small third-order distortion, and therefore, is widely known as a device suitable for digital-modulation mobile telephone systems which require a highly linear operation. Particularly, a radio frequency power amplifier which handles a radio frequency signal has a multi-finger structure in which a plurality of HBTs having an emitter finger are connected in parallel, and is configured so that a radio frequency signal is input to the base of each HBT and the collector outputs of the HBTs are combined to obtain a high power output.

However, when the multi-finger structure is used to try to obtain a high power output, since the thermal conductivity of the GaAs substrate is smaller than silicon and the like, the temperature increase of the device becomes significant, depending on the output, likely leading to a deterioration in radio frequency characteristics. Particularly in the HBT, a high power output causes a temperature increase, so that a base-emitter voltage Vbe decreases, resulting in an increase in collector current. Therefore, if concentration of a current (an increase in collector current) occurs in any one of the HBTs in the multi-finger structure for some cause, a temperature increase occurs, so that further current concentration occurs in the one HBT. When such non-uniformity occurs in a current distribution, a specific HBT no longer performs a desired operation, so that a power corresponding to the plurality of HBTs connected in parallel cannot be obtained, resulting in a deterioration in radio frequency characteristics. When this phenomenon develops, the HBT may go into thermal runaway and be broken down.

Conventional radio frequency power amplifiers which solve the problem have been proposed in U.S. Pat. No. 5,608,353 (Patent Document 1), Japanese Patent Laid-Open Publication No. 2001-274636 (Patent Document 2), and the like. In the radio frequency power amplifier described in Patent Document 1, a ballast resistance is inserted into the base of each HBT, and a negative feedback is applied to the base-emitter voltage Vbe of each HBT with respect to a current increase, thereby preventing current concentration into a specific HBT to provide a uniform distribution. Thereby, breakdown due to thermal runaway and a deterioration in radio frequency characteristics can be eliminated.

FIG. 8 illustrates an exemplary circuit of a conventional radio frequency power amplifier 100 in which n HBTs (n: an integer of 2 or more) are connected in parallel. In FIG. 8, a direct-current bias voltage DC is applied via resistances R101 to R10n to the bases of transistors Q101 to Q10n. A radio frequency signal RF is input via capacitor C101 to C10n to the bases of the transistors Q101 to Q10n. All the emitters of the transistors Q101 to Q10n are grounded, and amplified signals output from the collectors of the transistors Q101 to Q10n are combined into one.

In the case of the configuration of FIG. 8, even when current concentration occurs in any of the transistors Q101 to Q10n for some cause, a voltage drop corresponding to a base current occurs in the resistances R101 to R10n connected between the bases of the respective transistors Q101 to Q10n and the input terminal of the bias voltage DC. The voltage drop relaxes the current concentration, so that a uniform collector current flows through the transistors Q101 to Q10n, resulting in a uniform operation. Therefore, a stable operation can be achieved without breakdown due to thermal runaway and a deterioration in radio frequency characteristics.

However, when the conventional radio frequency power amplifier 100 thus configured is applied to an apparatus which transmits and receives a radio frequency signal RF, the reception of the radio frequency signal RF by the apparatus is considered to be affected as follows. For example, in a WCDMA mobile telephone system, specific codes are assigned to data by signal spectrum spread for the purpose of communication. Also in the WCDMA mobile telephone system, a FDD (Frequency Division Duplex) method is used so as to simultaneously perform transmission and reception with respect to a mobile telephone terminal.

In such a mobile telephone system, a 1950-MHz band is used for a transmission frequency, a 2140-MHz band is used for a reception frequency, a transmission output level at an antenna end of a mobile telephone terminal is a maximum of about 25 dBm (1 mW=0 dBm), and a reception input level is a minimum of about −80 dBm. In this case, if noise characteristics of a transmitted signal Tx in a reception band are not satisfactory, noise occurs in a received signal Rx, so that appropriate signal demodulation cannot be performed, eventually leading to a deterioration in speech quality (reception band noise NRx).

The reception band noise NRx of the radio frequency power amplifier can be divided into noise occurring from the device itself and noise due to InterModulation (IM). In order to reduce the reception band noise NRx of the radio frequency power amplifier, it is considerably important to particularly reduce the noise occurring due to intermodulation.

As used herein, the noise occurring due to intermodulation refers to noise which, when a transmission frequency (basic wave) is modulated with an arbitrary frequency component, appears as a distorted component at a frequency which is at a difference between these frequencies away from the basic wave. Assuming that a 1950-MHz band is used for the transmission frequency and a 2140-MHz band is used for the reception frequency, it is particularly important to handle a signal in a 190-MHz band which is a difference between these frequencies, and a signal in a 95-MHz band which is a ½ frequency of the difference frequency in view of an influence of intermodulation on the reception band noise NRx due to the transmitted signal Tx.

FIGS. 9A and 9B illustrate characteristics of a second-order intermodulation distortion (IMD2) and a third-order intermodulation distortion (IMD3) of the radio frequency power amplifier, respectively. When the transmitted signal Tx of 1950 MHz and a signal of 190 MHz are input to the radio frequency power amplifier, a noise component (IMD2) occurs in a 2140-MHz band which is at 190 MHz away from 1950 MHz (basic wave). When the transmitted signal Tx of 1950 MHz and a signal of 95 MHz are input to the radio frequency power amplifier, a noise component (IMD3)

occurs in a 2140-MHz band which is at 190 MHz away from 1950 MHz (basic wave). Reception band noise characteristics deteriorate with magnitudes of IMD2 and IMD3. The magnitudes of IMD2 and IMD3 correspond to magnitudes of the transmitted signal Tx of 1950 MHz, the signal of 190 MHz, and the signal of 95 MHz. Considering that 1950 MHz corresponds to a maximum output of 25 dBm, it is clearly understood that it is important to decrease the signals of 190 MHz and 95 MHz so as to reduce IMD2 and IMD3.

FIG. 10 illustrates frequency pass characteristics of each HBT in a conventional radio frequency power amplifier comprising three HBTs. In these three HBTs, the radio frequency signal RF is input via a capacitor to the base of each HBT, and relatively large gains are obtained: a gain in the 190-MHz band (IMD2) is about −10 dB; and a gain in the 95-MHz band (IMD3) is about −20 dB. Note that the HBTs have the same frequency pass characteristics. Therefore, a gain of the radio frequency signals RF combined at an output terminal Pout is +14.8 dB. In such a case, a gain in the 190-MHz band is −5.2 dB and a gain in the 95-MHz band is −15.2 dB, i.e., these values are relatively large, so that IMD2 and IMD3 are not sufficiently reduced, resulting in high reception band noise characteristics.

FIG. 11 illustrates a relationship between the transmitted signal Tx and the received signal Rx, and the noise characteristics of the radio frequency power amplifier when a state of radio wave is poor (at an antenna end, a transmission output is maximum and a reception input is minimum). The level of the received signal Rx is considerably smaller than that of the transmitted signal Tx, so that the noise characteristics of the radio frequency power amplifier are not sufficiently reduced in the vicinity of a reception band, and have almost the same level as that of the received signal Rx. Therefore, it is difficult to identify the received signal Rx, so that a signal to be originally demodulated is not read, resulting in an increase in code error rate and a deterioration in speech quality.

SUMMARY OF THE INVENTION

Therefore, an object of the present invention is to provide a radio frequency power amplifier having a stable operation, high efficiency, and low noise.

The present invention is directed to a radio frequency power amplifier for power amplification of a radio frequency signal. To achieve the object, the radio frequency power amplifier of the present invention comprises n transistors connected in parallel, wherein n is an integer of 2 or more and emitters thereof are grounded, n resistances each having a first terminal and a second terminal, wherein a direct-current bias voltage are connected in common to the first terminals of the n resistances, and the second terminals of the n resistances are connected to bases of the n transistors, respectively, m capacitors each having a first electrode and a second electrode, wherein m is an integer of 1≦m<n, the radio frequency signal is input in common to the first electrodes of the m capacitors, and the second electrodes of the m capacitors are connected to the bases of m transistors of the n transistors, respectively, and at least one band rejection filter provided between the bases of the m transistors connected to the m capacitors and the bases of the n-m transistors not connected to the m capacitors, wherein the at least one band rejection filter passes substantially only radio frequency components.

Here, when the radio frequency power amplifier is composed of an odd number of transistors, it is preferable that each of the bases of the n-m transistors not connected to the m capacitors be connected to the bases of any two of the m transistors connected to the m capacitors via two of the band rejection filters.

Typically, the band rejection filter has characteristics that a difference frequency between a reception frequency and a transmission frequency of the radio frequency signal, and a ½ frequency of the difference frequency, are rejected. The whole or a part of the band rejection filter can be composed of a capacitor. The first terminals of the n resistances and the first electrodes of the m capacitors may be connected in common, and the radio frequency signal and a bias voltage may be input together to the terminals connected in common. The band rejection filter may have characteristics that either a difference frequency between a reception frequency and a transmission frequency of the radio frequency signal, or a ½ frequency of the difference frequency, is rejected.

According to the present invention, one or two radio frequency signals which have been passed through a band rejection filter which rejects desired frequency bands, is input to at least one of a plurality of transistors. Thereby, a gain in a frequency band in which second-order and third-order intermodulation distortions occur, can be attenuated while maintaining a gain in a frequency band for a transmitted signal, thereby making it possible to obtain satisfactory reception band noise characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
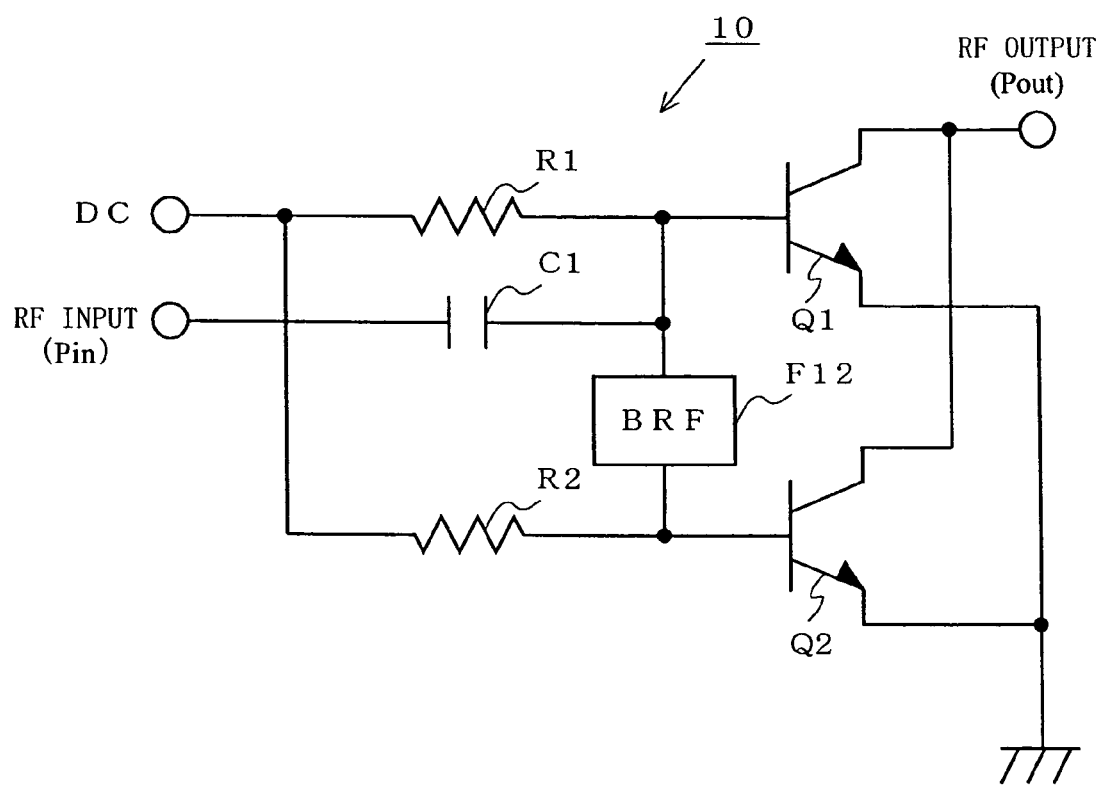
FIGS. 1A to 1D are diagrams illustrating exemplary circuit configurations of a radio frequency power amplifier 10 according to a first embodiment of the present invention.
Figure 1B:
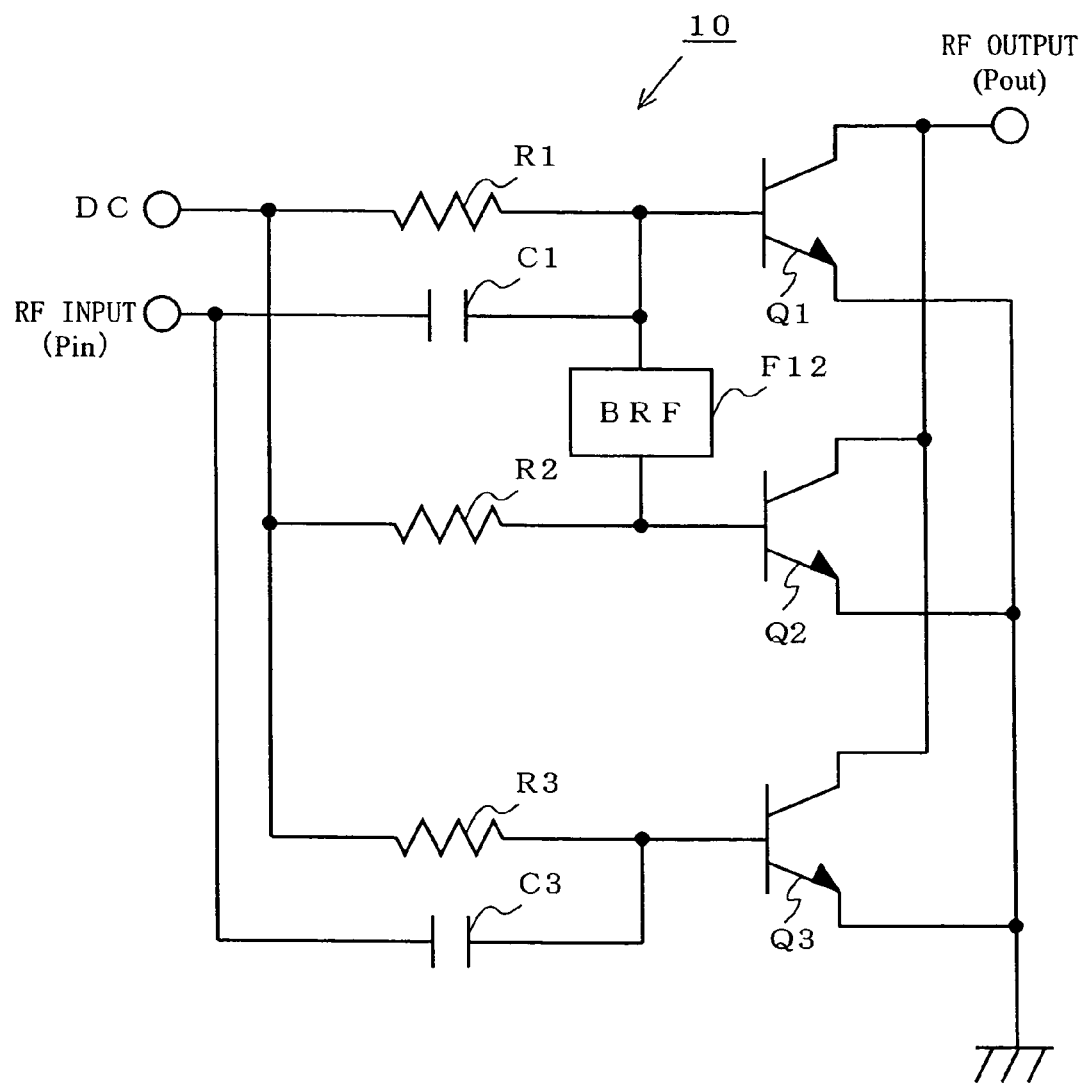
Figure 1C:
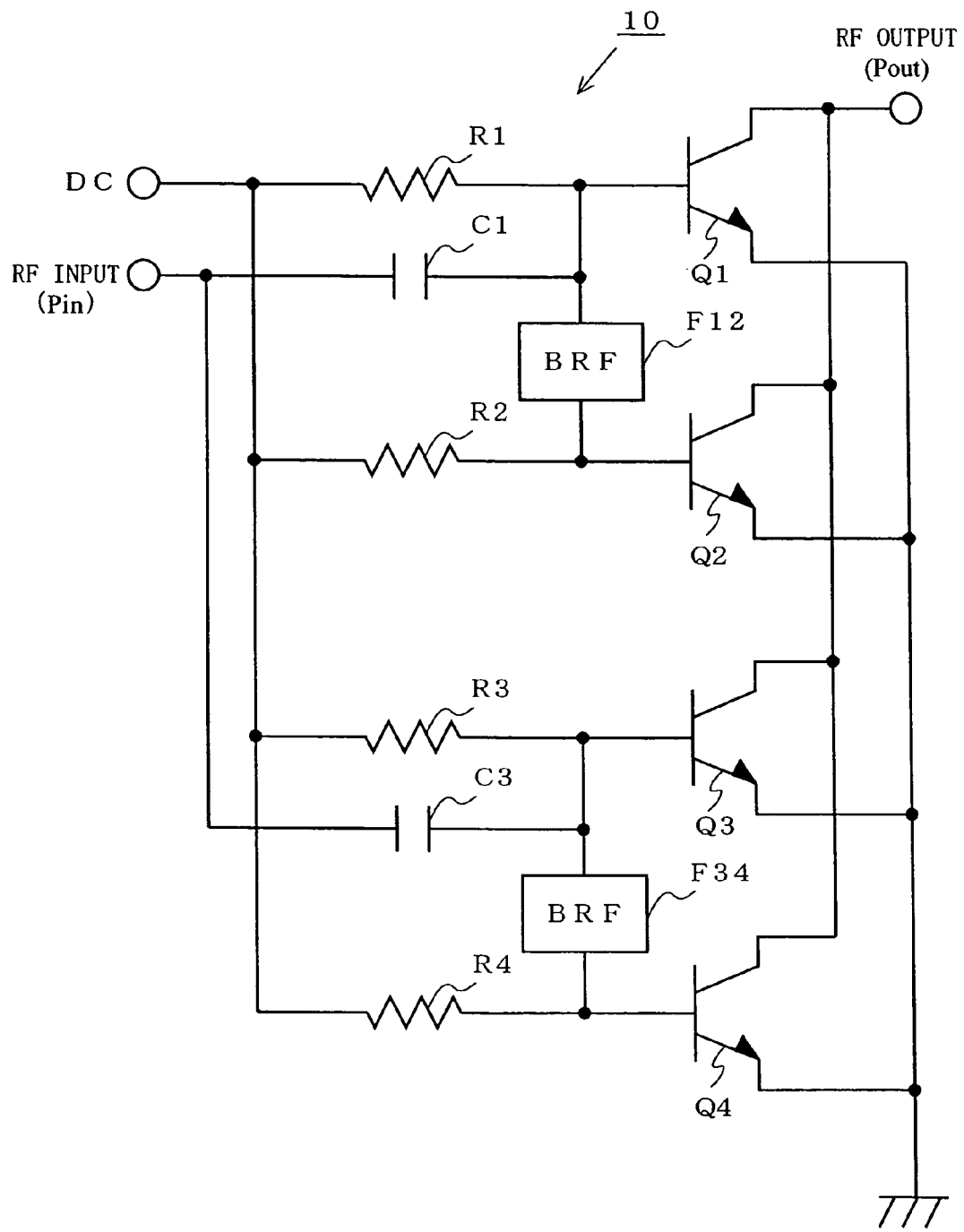
Figure 1D:
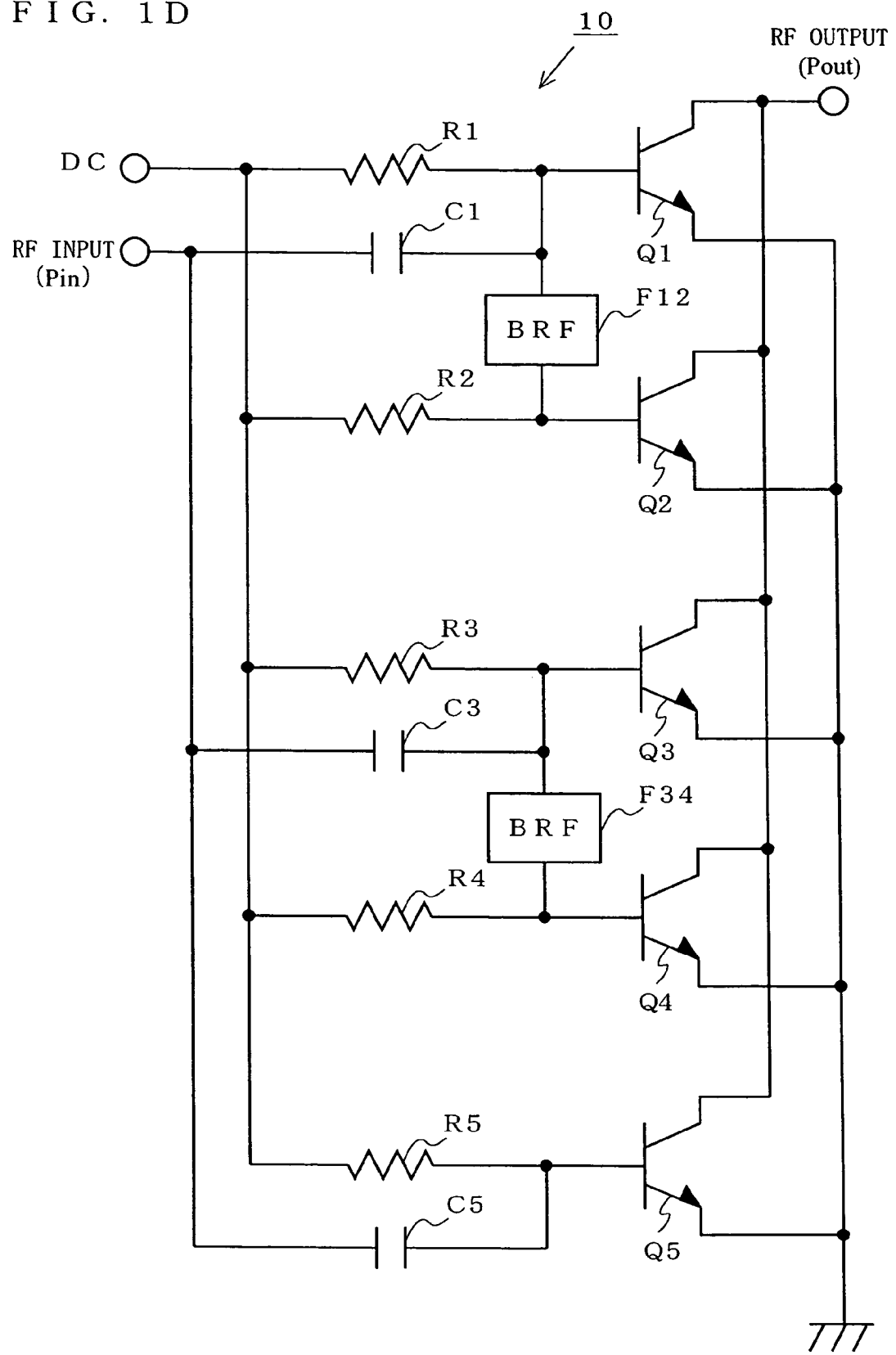

FIGS. 1A to 1D are diagrams illustrating exemplary circuit configurations of a radio frequency power amplifier 10 according to a first embodiment of the present invention. In the exemplary circuit configurations of FIGS. 1A to 1D, the number of transistors is two to five. As can be seen from these figures, the radio frequency power amplifier 10 of the first embodiment is characterized in that, in a multi-finger structure in which two or more transistors are connected in parallel, at least one transistor receives a radio frequency signal via a band rejection filter (BRF). Note that a circuit configuration having six or more transistors can be easily achieved by appropriately combining some radio frequency power amplifiers having two transistors (FIG. 1A) and/or some radio frequency power amplifiers having three transistors (FIG. 1B).

Hereinafter, as a representative radio frequency power amplifier 10 of the first embodiment of the present invention, a configuration and an operation of a radio frequency power amplifier having three transistors will be described (FIG. 1B).

In FIG. 1B, the radio frequency power amplifier 10 comprises transistors Q1 to Q3, resistances R1 to R3, capacitors C1 and C3, and a band rejection filter F12. A direct-current bias voltage DC is applied via the resistance R1 to the base of the transistor Q1, and a radio frequency signal RF is input via the capacitor C1 to the base of the transistor Q1. The bias voltage DC is applied via the resistance R2 to the base of the transistor Q2. The bias voltage DC is applied via the resistance R3 to the base of the transistor Q3, and the radio frequency signal RF is input via the capacitor C3 to the base of the transistor Q3. The band rejection filter F12 is provided between the base of the transistor Q1 and the base of the transistor Q2. The collectors of the transistors Q1 to Q3 are connected in common and the emitters thereof are all grounded.

With the above-described configuration, the radio frequency power amplifier 10 of the first embodiment can solve the following two problems.

Firstly, regarding a direct current component, the resistances R1 to R3 are inserted between an input terminal of the bias voltage DC and the bases of the transistors Q1 to Q3, respectively. Due to the resistances R1 to R3, if current concentration (an increase in collector current) occurs in any of the transistors, a voltage drop corresponding to a base current occurs. The voltage drop relaxes the current concentration, so that a uniform collector current flows through the transistors Q1 to Q3, resulting in a uniform operation. Therefore, as in conventional radio frequency power amplifiers, a stable operation can be achieved without breakdown due to thermal runaway and a deterioration in radio frequency characteristics.

Next, regarding an alternating current (a radio frequency) component, the radio frequency signal RF is input via the capacitor C1 to the base of the transistor Q1 and via the capacitor C3 to the base of the transistor Q3. On the other hand, the base of the transistor Q2 receives the radio frequency signal RF which has been passed through the capacitor C1 and the band rejection filter F12. Thus, by inputting the radio frequency signal RF via the band rejection filter F12 to the transistor Q2, only output characteristics of the transistor Q2 can be changed. Therefore, if the band rejection filter F12 is appropriately set, IMD2 and IMD3 can be sufficiently reduced, thereby making it possible to suppress the reception band noise NRx to a low level.

Figure 2:
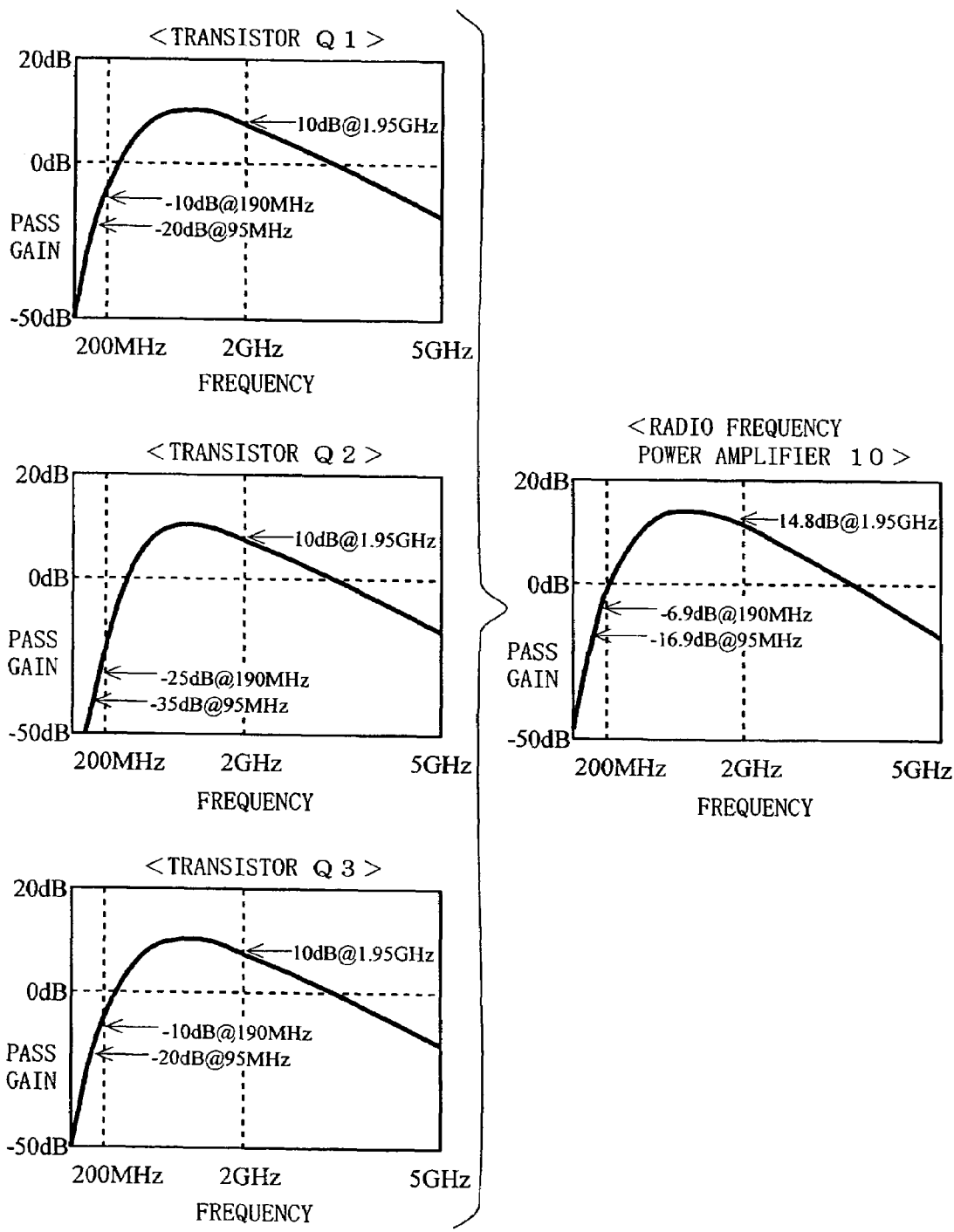
FIG. 2 is a diagram illustrating exemplary frequency pass characteristics of the radio frequency power amplifier 10 of FIG. 1B.

FIG. 2 illustrates exemplary frequency pass characteristics of the radio frequency power amplifier 10 of the first embodiment. The characteristics of FIG. 2 are suitable for a mobile telephone system in which a 1950-MHz band is used for a transmission frequency and a 2140-MHz band is used for a reception frequency.

For the sake of easy comparison, the frequency pass characteristics of the transistor Q1 and Q3 are assumed to be the same as those described in the Description of the Background Art section. Specifically, a gain in the 1950-MHz band (transmission frequency) is about +10 dB, a gain in a 190-MHz band (IMD2) is about −10 dB, and a gain in a 95-MHz band (IMD3) is about −20 dB.

Characteristics of the band rejection filter F12 are previously designed to reject a difference frequency between a reception frequency and a transmission frequency (i.e., a gain in the 190-MHz band), and a ½ frequency of the difference frequency (i.e., a gain in the 95-MHz band), and pass other frequency bands. The transistor Q2 performs power amplification of the radio frequency signal RF whose components in the 190-MHz band and the 95-MHz band have been attenuated through the band rejection filter F12, and therefore, can obtain frequency pass characteristics that a gain is maintained with respect to the basic wave and gains are considerably lowered with respect to IMD2 and IMD3. Thereby, the following characteristics are obtained: a gain in the 1950-MHz band (transmission frequency) is about +10 dB; a gain in the 190-MHz band (IMD2) is about −25 dB; and a gain in the 95-MHz band (IMD3) is about −35 dB.

Therefore, collective frequency pass characteristics of the radio frequency power amplifier 10 in which the outputs of the transistors Q1 to Q3 are combined, are as follows: a gain in the 1950-MHz band (transmission frequency) is about +14.8 dB; a gain in the 190-MHz band (IMD2) is about −6.9 dB; and a gain in the 95-MHz band (IMD3) is about −16.9 dB. Therefore, the frequency pass characteristics of the radio frequency power amplifier 10 of the present invention improves the gains in the 190-MHz band and the 95-MHz band by about −1.7 dB, respectively, as compared to the conventional radio frequency power amplifier 100. As a result, a second order intermodulation distortion IMD2 occurring in the 2140-MHz band due to second-order intermodulation of a transmitted signal in the 1950-MHz band and a signal in the 190-MHz band, is improved by about −1.7 dB, and a third-order intermodulation distortion IMD3 occurring in the 2140-MHz band due to third-order intermodulation of a transmitted signal in the 1950-MHz band and a signal in the 95-MHz band, is improved by about −1.7×2=−3.4 dB. Therefore, the reception band noise NRx can be improved by (−1.7)+(−3.4)=−5.1 dB, thereby making it possible to obtain satisfactory reception band noise characteristics.

Figure 3:
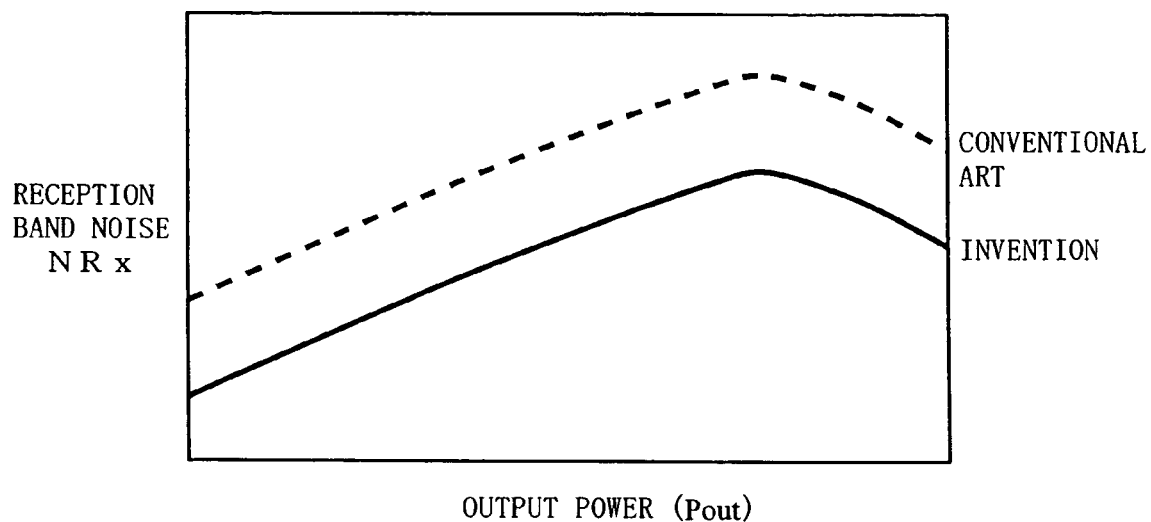
FIG. 3 is a diagram illustrating a relationship between an output power and reception band noise NRx in the radio frequency power amplifier 10 of FIG. 1B.

FIG. 3 illustrates a relationship between an output power Pout and the reception band noise NRx in the radio frequency power amplifier 10 of the first embodiment. As can be seen from FIG. 3, by the reduction of the gains in the 190-MHz band and the 95-MHz band, the reception band noise NRx can be satisfactorily maintained as compared to the conventional art.

Figure 4:
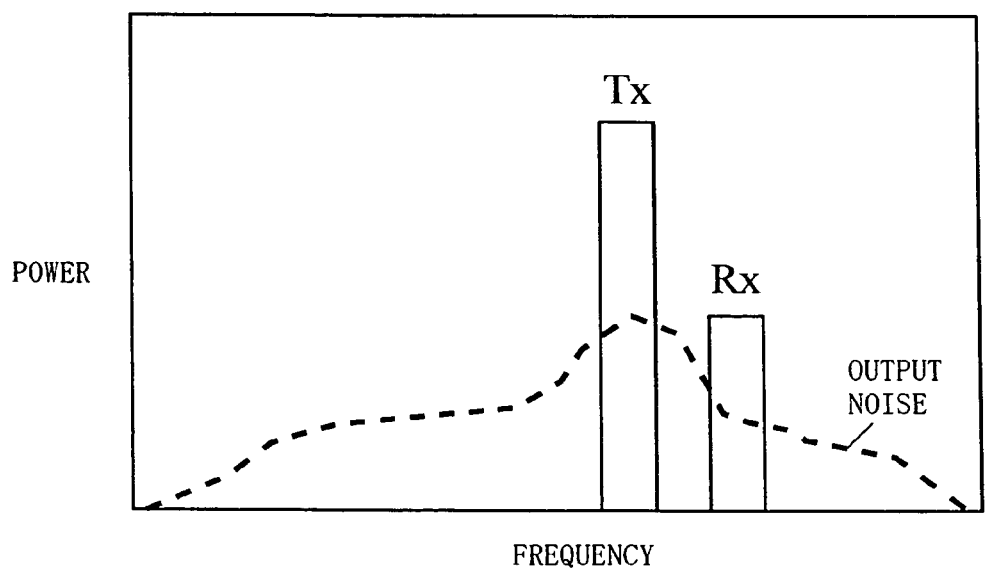
FIG. 4 is a diagram illustrating a relationship between a transmitted signal Tx and a received signal Rx, and noise characteristics of the radio frequency power amplifier 10 of FIG. 1B when a state of radio wave is poor.

FIG. 4 is a diagram illustrating a relationship between the transmitted signal Tx and the received signal Rx, and the noise characteristics of the radio frequency power amplifier 10 when a state of radio wave is poor (at an antenna end, a transmission output is maximum and a reception input is minimum). The received signal Rx has a considerably small level, compared to the transmitted signal Tx. Under such a condition, the output noise characteristics of the radio frequency power amplifier 10 can be sufficiently reduced (i.e., to a sufficiently low level) in the vicinity of a reception band, compared to the received signal Rx. Therefore, the received signal Rx can be easily identified, so that a signal to be demodulated can be satisfactorily read. Therefore, it is possible to prevent an increase in code error rate, and enable high-quality speech.

As described above, according to the radio frequency power amplifier of the first embodiment of the present invention, the radio frequency signal RF which has been passed through a band rejection filter which rejects a desired frequency band, is input to at least one of a plurality of transistors. Thereby, gains in frequency bands in which second-order and third-order intermodulation distortions occur, can be attenuated while maintaining a gain in a frequency band for the transmitted signal Tx, thereby making it possible to obtain satisfactory reception band noise characteristics.

Second Embodiment

In the configuration of the radio frequency power amplifier 10 of the first embodiment, a band rejection filter is associated with one transistor to which the radio frequency signal RF is not directly input. However, actually, in some cases, it is difficult to obtain characteristics that gains in second-order and third-order intermodulation frequency bands are significantly attenuated while maintaining a gain in a transmission frequency band, using a single band rejection filter, because of limitation on a circuit scale, cost or the like of the band rejection filter.

Therefore, in the second embodiment, a radio frequency power amplifier will be described in which two band rejection filters are associated with a transistor to which the radio frequency signal RF is not directly input.

Figure 5A:
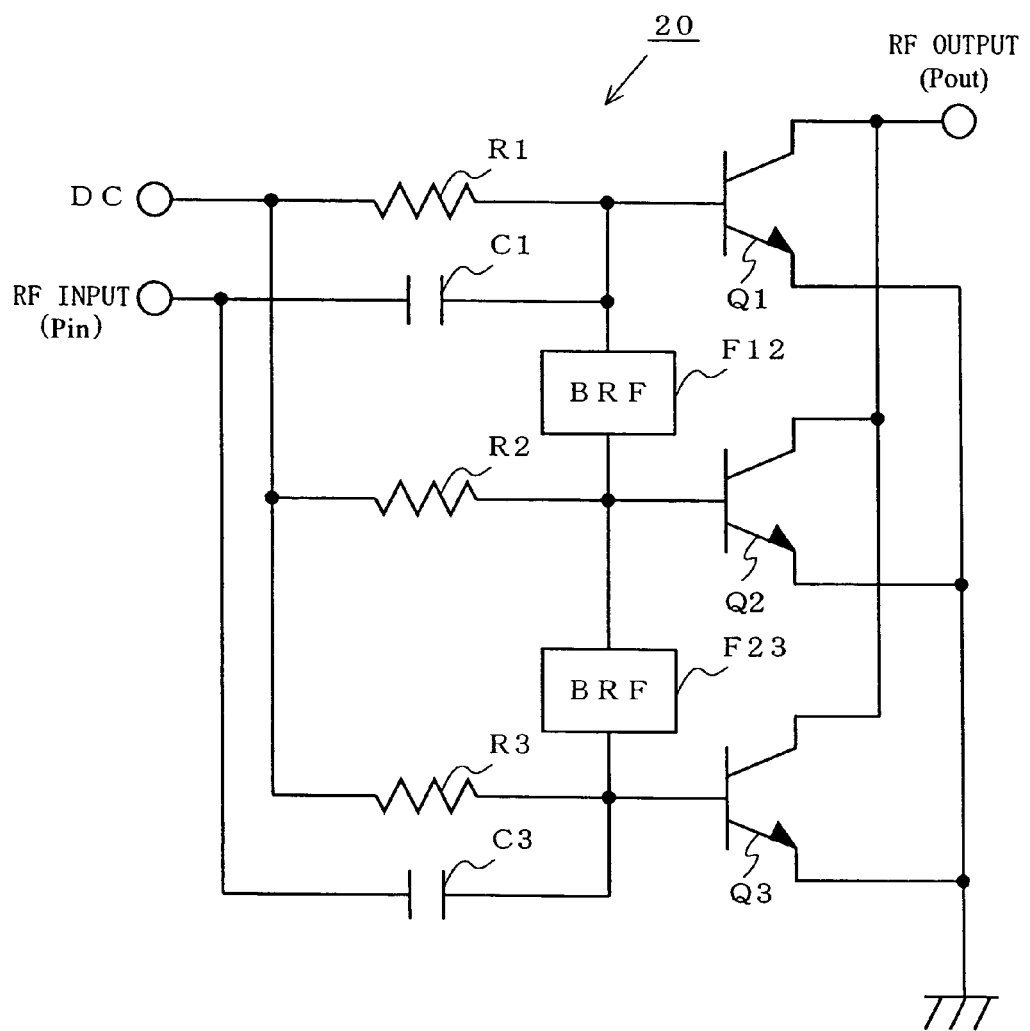
FIGS. 5A and 5B are diagrams illustrating exemplary circuit configurations of a radio frequency power amplifier 20 according to a second embodiment of the present invention.
Figure 5B:
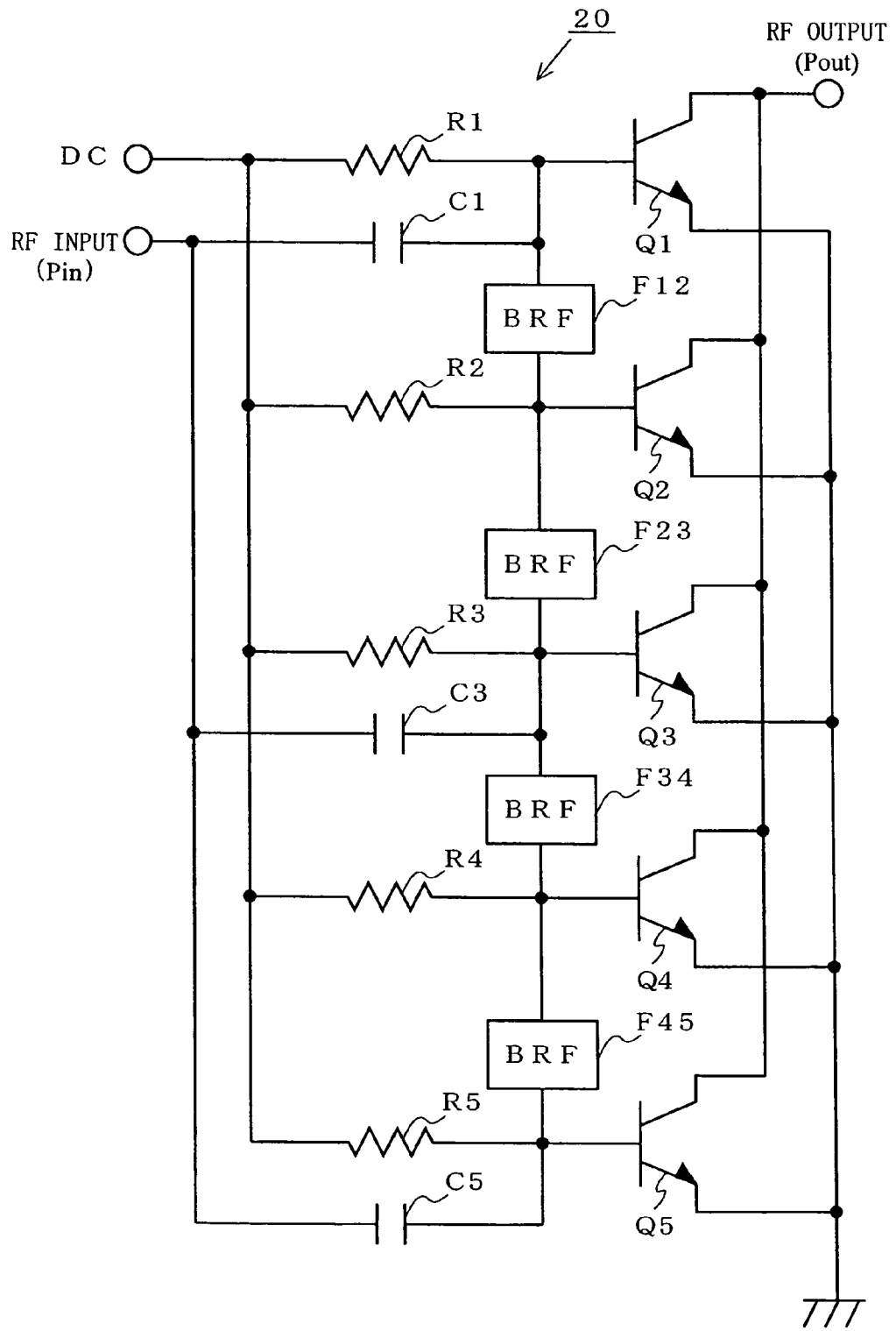

FIGS. 5A and 5B are diagrams illustrating exemplary circuit configurations of a radio frequency power amplifier 20 according to a second embodiment of the present invention. In the exemplary circuit configurations of FIGS. 5A and 5B, the number of transistors is three and five. As can be seen from these figures, the radio frequency power amplifier 20 of the second embodiment is characterized in that, in a multi-finger structure in which an odd number of three or more transistors are connected in parallel, at least one transistor receives and combines two radio frequency signals via two band rejection filters (BRFs). Note that a circuit configuration having an odd number of seven or more transistors can be easily obtained according to the rule indicated in FIGS. 5A and 5B.

Hereinafter, as a representative radio frequency power amplifier 20 of the second embodiment of the present invention, a configuration and an operation of a radio frequency power amplifier having three transistors (FIG. 5A) will be described.

In FIG. 5A, the radio frequency power amplifier 20 comprises transistors Q1 to Q3, resistances R1 to R3, capacitors C1 and C3, and band rejection filters F12 and F23. As can be seen from FIG. 5A, the configuration of the radio frequency power amplifier 20 of the second embodiment is the same as that of the radio frequency power amplifier 10 of the first embodiment (FIG. 1B), except for the band rejection filter F23 additionally provided.

A bias voltage DC is applied via the resistance R1 to the base of the transistor Q1, and a radio frequency signal RF is input via the capacitor C1 to the base of the transistor Q1. The bias voltage DC is applied via the resistance R2 to the base of the transistor Q2. The bias voltage DC is applied via the resistance R3 to the base of the transistor Q3, and the radio frequency signal RF is input via the capacitor C3 to the base of the transistor Q3. The band rejection filter F12 is provided between the base of the transistor Q1 and the base of the transistor Q2. The band rejection filter F23 is provided between the base of the transistor Q2 and the base of the transistor Q3. The collectors of the transistors Q1 to Q3 are connected in common and the emitters thereof are all grounded.

With this configuration, regarding an alternating current (a radio frequency) component, the radio frequency signal RF is input via the capacitor C1 to the base of the transistor Q1 and via the capacitor C3 to the base of the transistor Q3. On the other hand, the radio frequency signal RF which has been passed through the capacitor C1 and the band rejection filter F12 and the radio frequency signal RF which has been passed through the capacitor C3 and the band rejection filter F23, are combined and input to the base of the transistor Q2. For example, when the radio frequency power amplifier 20 of the second embodiment is applied to a mobile telephone system in which the 1950-MHz band is used for a transmission frequency and the 2140-MHz band is used for a reception frequency, the band rejection filters F12 and F23 may be designed so that the transistor Q2 which receives the combined radio frequency signal RF has frequency pass characteristics which are illustrated in <TRANSISTOR Q2> of FIG. 2.

As described above, according to the radio frequency power amplifier of the second embodiment of the present invention, the two radio frequency signals RF which have been passed through band rejection filters which reject desired frequency bands, are combined and input to at least one of a plurality of transistors. Thereby, it is possible to easily secure a desired gain in a frequency band for the transmitted signal Tx.

Figure 6:
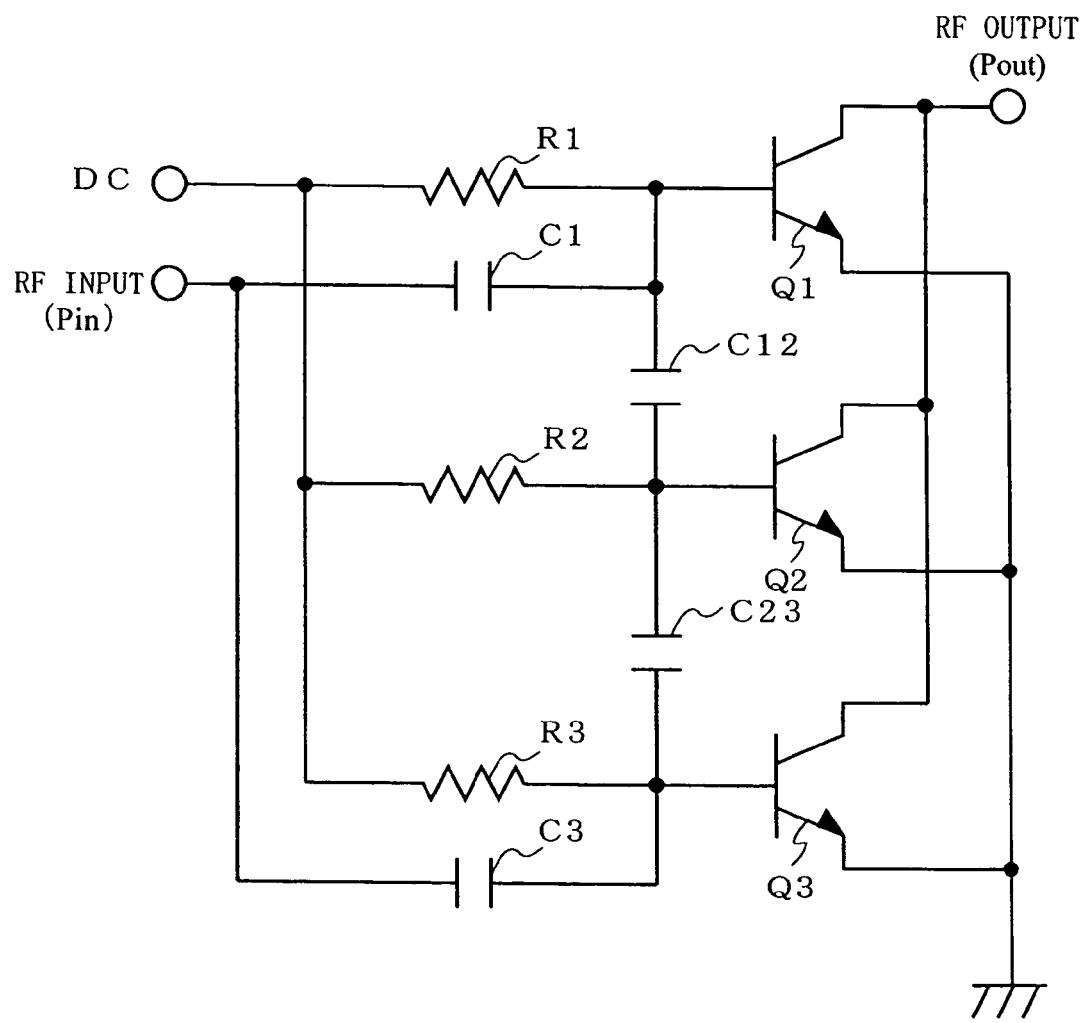
FIG. 6 is a diagram illustrating an applied example of the radio frequency power amplifiers 10 and 20.

Note that the band rejection filter described in the first and second embodiments may be a capacitor (simplest configuration). FIG. 6 illustrates an exemplary configuration of the radio frequency power amplifier 20 of FIG. 5A where the band rejection filters F12 and F23 are replaced with capacitors C12 and C23. Thus, by configuring the band rejection filter using a relatively simple element, such as a capacitor, it is possible to attenuate a gain in a frequency band in which second-order and third-order intermodulation distortions occur, without a reduction in a gain in a frequency band for the transmitted signal Tx. In addition, by using a capacitor, it is possible to simplify a circuit and reduce the size of an apparatus, and it is also possible to adjust the input matching of a radio frequency power amplifier to a desired value, thereby making it possible to achieve a higher-gain and higher-efficiency operation.

Figure 7:
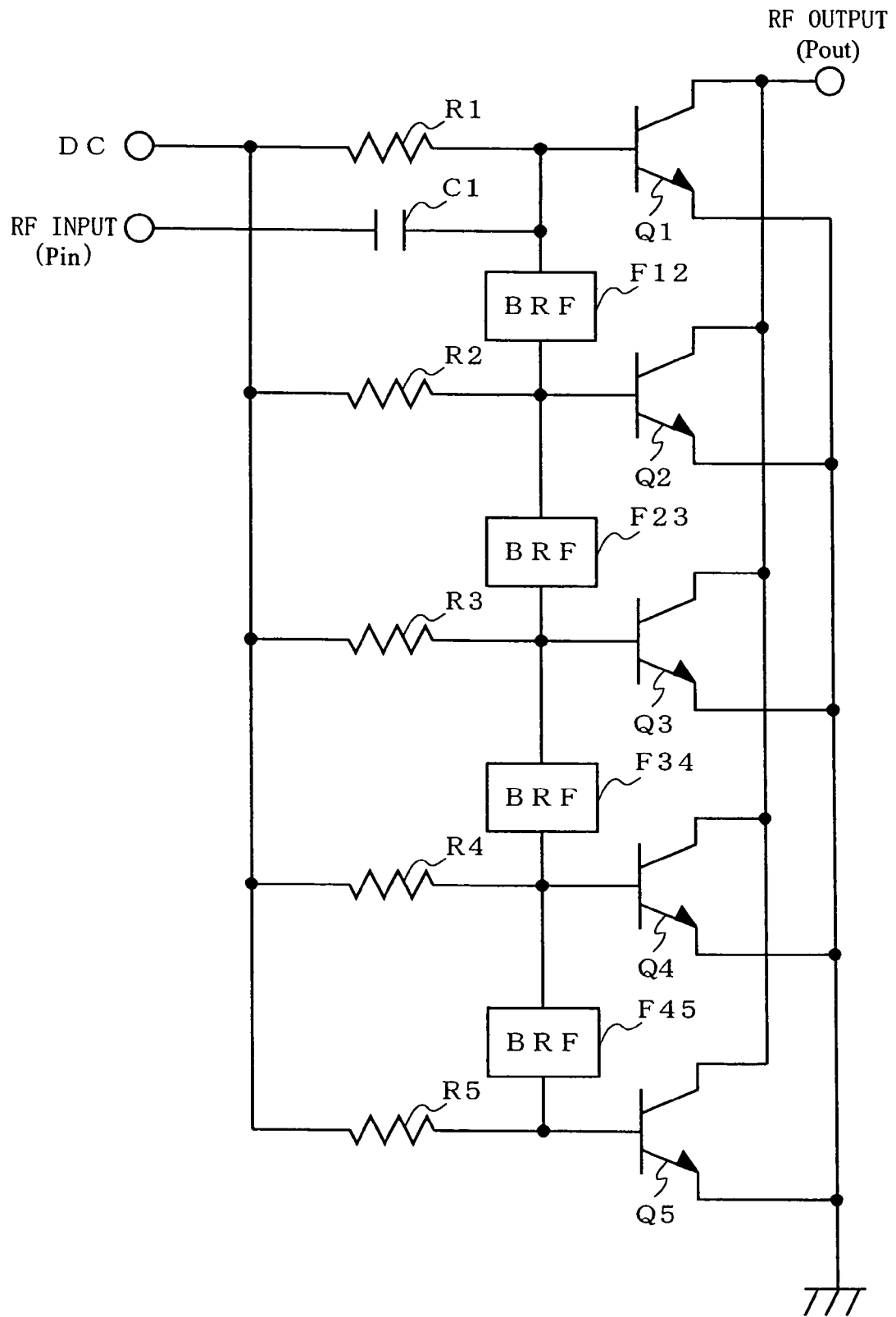
FIG. 7 is a diagram illustrating a variation of the radio frequency power amplifiers 10 and 20.
Figure 8:
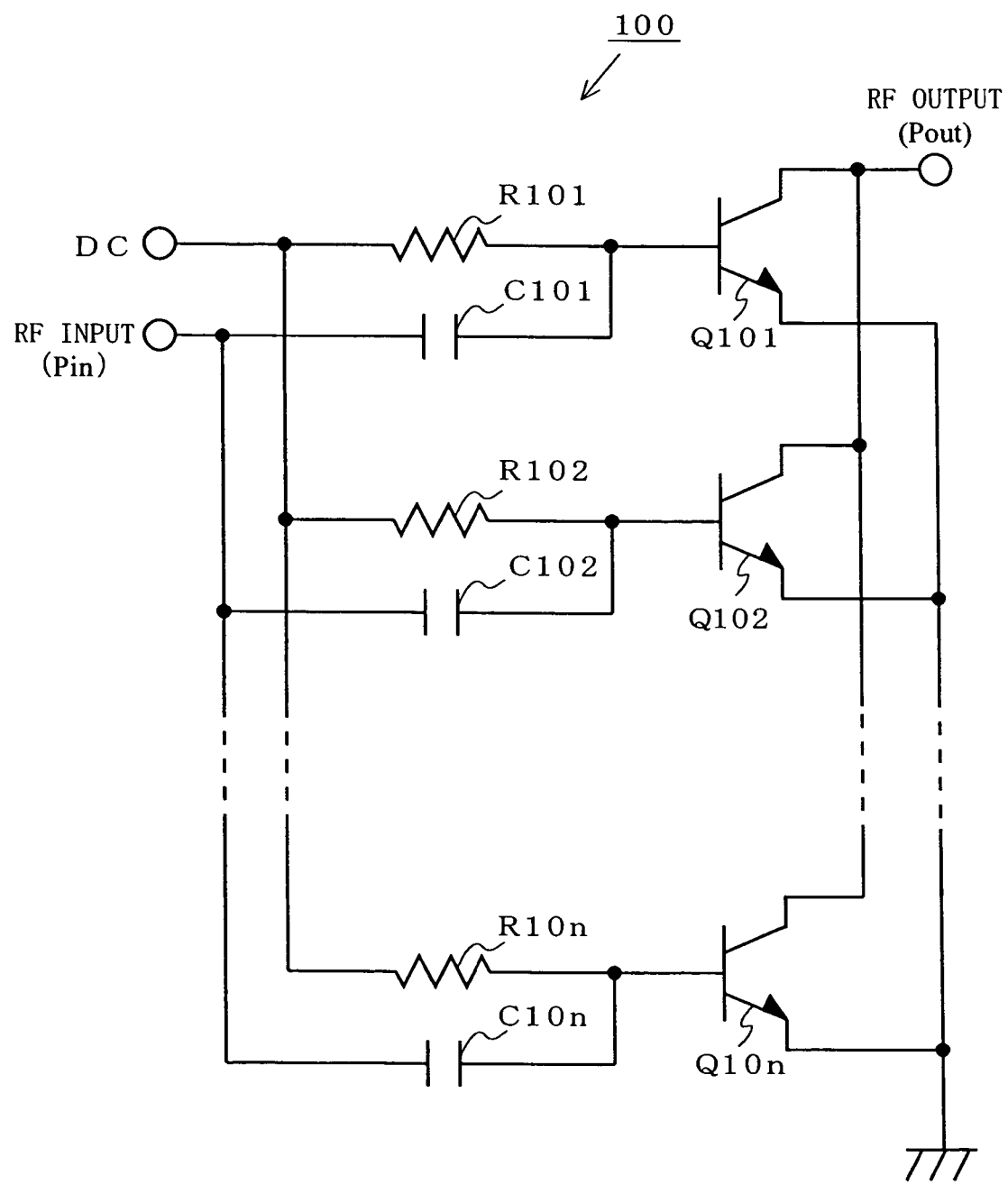
FIG. 8 is a diagram illustrating an exemplary circuit configuration of a conventional radio frequency power amplifier 100.
Figure 9A:
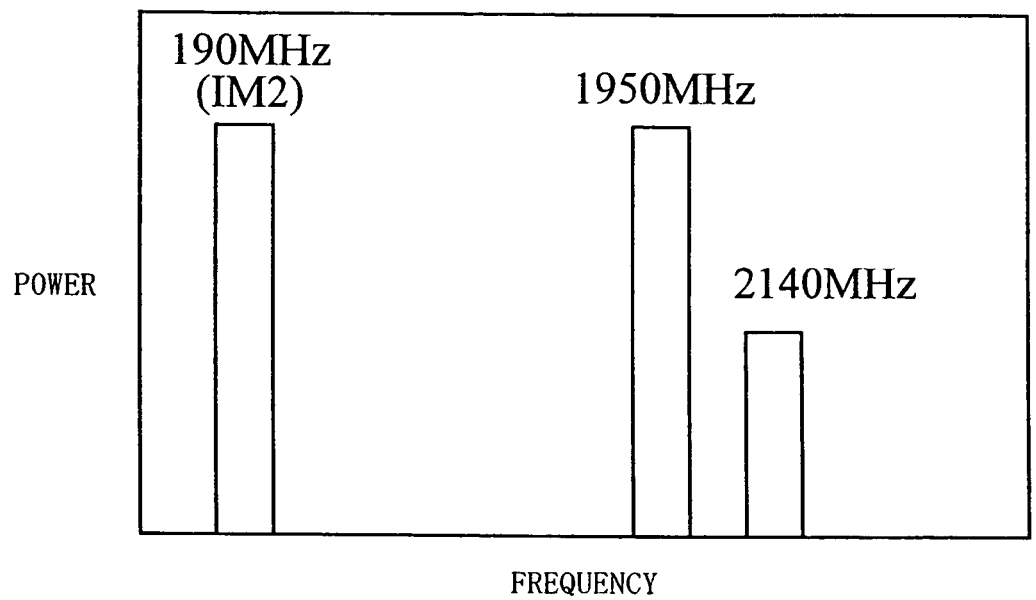
FIG. 9A is a diagram for explaining a second-order intermodulation distortion (IMD2) in a radio frequency power amplifier.
Figure 9B:
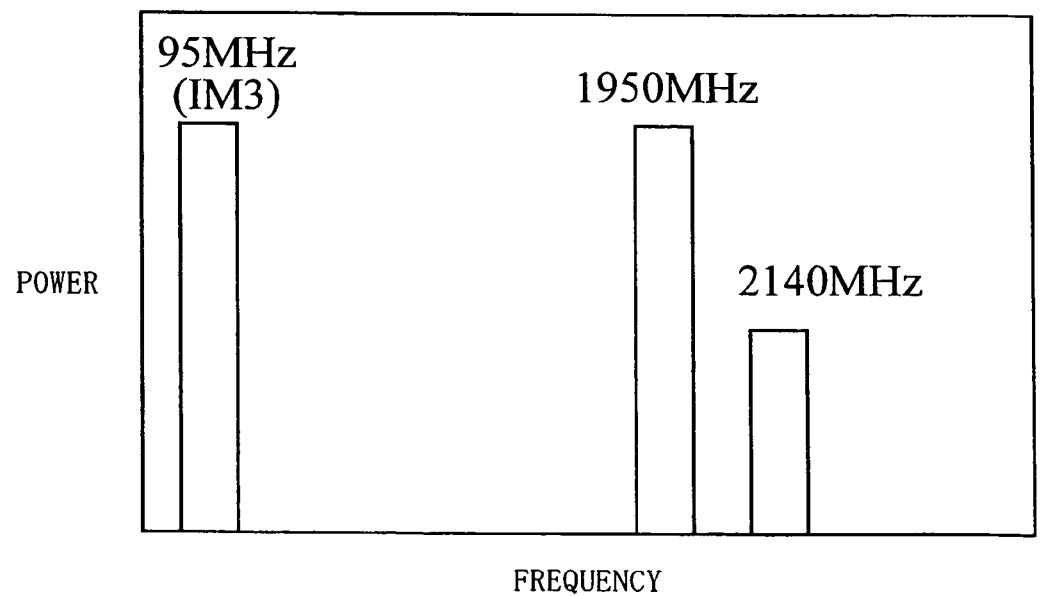
FIG. 9B is a diagram for explaining a third-order intermodulation distortion (IMD3) in a radio frequency power amplifier.
Figure 10:
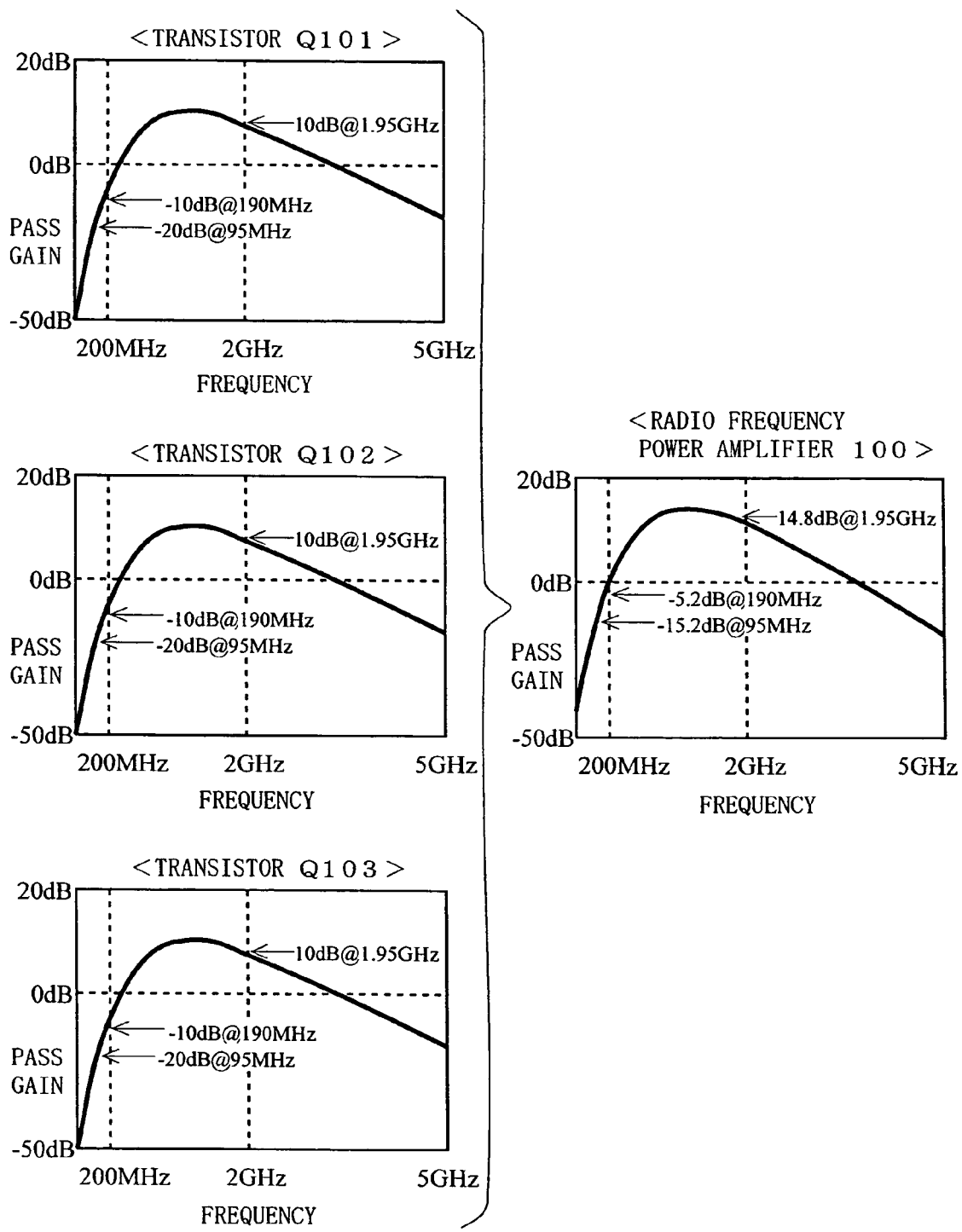
FIG. 10 is a diagram illustrating exemplary frequency pass characteristics of the conventional radio frequency power amplifier 100.
Figure 11:
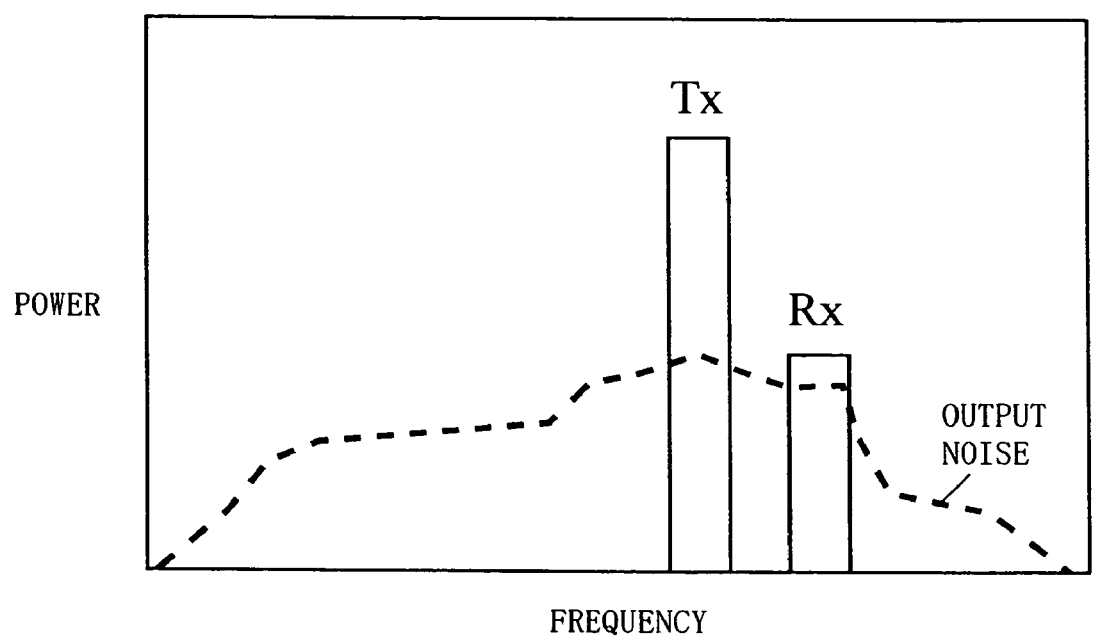
FIG. 11 is a diagram illustrating a relationship between a transmitted signal Tx and a received signal Rx, and noise characteristics of the conventional radio frequency power amplifier when a state of radio wave is poor.

If the band rejection filter described in the first and second embodiments can be designed with high precision, the radio frequency signal RF may be input only to any one of the transistors (the transistor Q1) and the radio frequency signal RF may be input to the other transistors Q2 to Q5 via a plurality of band rejection filters connected in series, as indicated in FIG. 7, for example.

The bias voltage DC and the radio frequency signal RF may be input separately to a transistor as described in the first and second embodiments. Alternatively, one terminal of a resistance and one electrode of a capacitor may be connected in common, and the bias voltage DC and the radio frequency signal RF may be input together to a transistor.

The above-described radio frequency power amplifier can be used not only in WCDMA, but also in various mobile communication schemes (CDMA(IS-95), GSM, EDGE, UMTS, PCS, DCS, PDC, CDMA2000, PHS, etc.).

While the invention has been described in detail, the foregoing description is in all aspects illustrative and not restrictive. It is understood that numerous other modifications and variations can be devised without departing from the scope of the invention.

What is claimed is:

1. A radio frequency power amplifier for power amplification of a radio frequency signal, comprising:
   n transistors connected in parallel, wherein n is an integer of 2 or more and emitters thereof are grounded;
   n resistances each having a first terminal and a second terminal, wherein a direct-current bias voltage are connected in common to the first terminals of the n resistances, and the second terminals of the n resistances are connected to bases of the n transistors, respectively;
   m capacitors each having a first electrode and a second electrode, wherein m is an integer of $1 \leq m \leq n$, the radio frequency signal is input in common to the first electrodes of the m capacitors, and the second electrodes of the m capacitors are connected to the bases of m transistors of the n transistors, respectively; and
   at least one band rejection filter provided between the bases of the m transistors connected to the m capacitors and the bases of the n-m transistors not connected to the m capacitors, wherein the at least one band rejection filter passes substantially only radio frequency components.

2. The radio frequency power amplifier according to claim 1, wherein:
   the integer n is an odd number; and
   each of the bases of the n-m transistors not connected to the m capacitors is connected to the bases of any two of the m transistors connected to the m capacitors via two of the band rejection filters.

3. The radio frequency power amplifier according to claim 1, wherein:
   the band rejection filter has characteristics that a difference frequency between a reception frequency and a transmission frequency of the radio frequency signal, and a ½ frequency of the difference frequency, are rejected.

4. The radio frequency power amplifier according to claim 2, wherein:
   the band rejection filter has characteristics that a difference frequency between a reception frequency and a transmission frequency of the radio frequency signal, and a ½ frequency of the difference frequency, are rejected.

5. The radio frequency power amplifier according to claim 1, wherein:
   the whole or a part of the band rejection filter is composed of a capacitor.

6. The radio frequency power amplifier according to claim 2, wherein:
   the whole or a part of the band rejection filter is composed of a capacitor.

7. The radio frequency power amplifier according to claim 3, wherein:
   the whole or a part of the band rejection filter is composed of a capacitor.

8. The radio frequency power amplifier according to claim 4, wherein:
   the whole or a part of the band rejection filter is composed of a capacitor.

9. The radio frequency power amplifier according to claim 1, wherein:
   the first terminals of the n resistances and the first electrodes of the m capacitors are connected in common, and the radio frequency signal and a bias voltage are input together to the terminals connected in common.

10. The radio frequency power amplifier according to claim 2, wherein:
    the first terminals of the n resistances and the first electrodes of the m capacitors are connected in common, and the radio frequency signal and a bias voltage are input together to the terminals connected in common.

11. The radio frequency power amplifier according to claim 3, wherein:
    the first terminals of the n resistances and the first electrodes of the m capacitors are connected in common, and the radio frequency signal and a bias voltage are input together to the terminals connected in common.

12. The radio frequency power amplifier according to claim 4, wherein:
    the first terminals of the n resistances and the first electrodes of the m capacitors are connected in common, and the radio frequency signal and a bias voltage are input together to the terminals connected in common.

13. The radio frequency power amplifier according to claim 5, wherein:
    the first terminals of the n resistances and the first electrodes of the m capacitors are connected in common, and the radio frequency signal and a bias voltage are input together to the terminals connected in common.

14. The radio frequency power amplifier according to claim 6, wherein:
    the first terminals of the n resistances and the first electrodes of the m capacitors are connected in common, and the radio frequency signal and a bias voltage are input together to the terminals connected in common.

15. The radio frequency power amplifier according to claim 7, wherein:
    the first terminals of the n resistances and the first electrodes of the m capacitors are connected in common, and the radio frequency signal and a bias voltage are input together to the terminals connected in common.

16. The radio frequency power amplifier according to claim 8, wherein:
    the first terminals of the n resistances and the first electrodes of the m capacitors are connected in common, and the radio frequency signal and a bias voltage are input together to the terminals connected in common.

* * * * *